(12) United States Patent
Russell et al.

(10) Patent No.: US 6,336,592 B1
(45) Date of Patent: Jan. 8, 2002

(54) THERMAL CONTROL FOR A TEST AND MEASUREMENT INSTRUMENT

(75) Inventors: Brian G. Russell; Robert R. Kreitzer, both of Tigard; Christopher R. Coleman, Portland; Theodore S. Hetke, Beaverton, all of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/458,490

(22) Filed: Dec. 9, 1999

(51) Int. Cl.[7] ............................. F24F 7/00; H05K 7/20

(52) U.S. Cl. .................. 236/49.3; 236/35; 236/91 F; 236/DIG. 9; 165/80.3; 165/291

(58) Field of Search ................ 236/49.3, 15 BB, 236/35, 91 R, 91 F, DIG. 9; 165/80.3, 291, 299, 300; 417/14, 32; 257/721, 722; 361/695, 696, 697

(56) References Cited

U.S. PATENT DOCUMENTS

| | | | |
|---|---|---|---|
| 4,174,065 A | 11/1979 | Knauth | 236/35 X |
| 5,123,477 A | 6/1992 | Tyler | 239/91 F X |
| 5,209,398 A | 5/1993 | Drees | 236/91 F |
| 5,287,244 A | 2/1994 | Hileman et al. | 361/697 X |
| 5,364,026 A | 11/1994 | Kundert | 236/49.3 |
| 5,504,650 A | 4/1996 | Katsui et al. | 165/80.3 X |

*Primary Examiner*—Harry B. Tanner
(74) *Attorney, Agent, or Firm*—Thomas F. Lenihan

(57) ABSTRACT

A cooling system for a test and measurement instrument including a variable-speed fan, useful with different instruments having different configurations, employs a plurality of sensors disposed at predetermined locations within an enclosure of the instrument, and is software programmable with predetermined parameters of each particular configuration of each particular instrument. At least one of the sensors measures the temperature of a component that dissipates power at a substantially constant rate, and at least one of the sensors does not include a heat source to provide heat for measurement.

11 Claims, 4 Drawing Sheets

THERMAL CONTROL FOR A TEST AND MEASUREMENT INSTRUMENT

FIELD OF THE INVENTION

The subject invention generally concerns cooling systems for electronic equipment and in particular concerns a variable fan-speed control for electronic test equipment.

BACKGROUND OF THE INVENTION

Fans are commonly used to provide an adequate supply of cooling air to the interior of an electronic unit, such as a desktop computer, to prevent the unit from overheating. How much air is adequate depends on several factors including the heat generated by the internal components, the ambient temperature at the location where the instrument happens to be operating, and the altitude at which the unit happens to be operating. Clearly, a manufacturer cannot generally control the conditions at the location where the unit will be operated. Therefore, if fixed-speed fans are employed for this purpose, then one must design for worst case conditions. Unfortunately, fixed speed fans selected to handle worst case conditions must move large quantities of air and therefore tend to be noisy. In an office environment, a noisy fan in a computer or other instrument is undesirable.

It has been recognized that those users who operate equipment in worse case conditions are only a small percentage of the total number of users. In most cases, variable speed fans could be substituted for fixed-speed fans, and the variable-speed fans could be operated at a slower, and quieter, speed.

U.S. Pat. No. 5,659,290 (Kundert), issued Apr. 21, 1987, discloses variable-speed fan having a sensor in the exhaust air stream. The fan of Kundert operates at a fixed rate of approximately half-speed until a given temperature is reached, and thereafter variably controls airflow through the fan. While this arrangement does react to some extent to internal temperatures, it assumes that half-speed is the minimum operating fan speed that is needed to effectively cool the instrument. That is, the fan of Kundert will run too fast (and consequently too noisily) if the fan speed actually required is less than half-speed. Moreover, Kundert does not directly monitor ambient air temperature.

Another variable-speed fan system is disclosed in U.S. Pat. No. 5,287,244 (Hileman, et al.), issued Feb. 15, 1994. Hileman, et al. adjust the fan speed in response to an input from an ambient air temperature sensor. Hileman, et al. describe a system that is operating in an open-loop manner. That is, if the ambient air temperature outside of the instrument increases, then the fan speed increases to move more cooling air across the components. While this too is an improvement over fixed-speed fan systems in general noise reduction, apparatus according to this patent exhibits a problem of its own because it does not sense internal case temperatures.

Because the apparatus of Hileman, et al. operates by reacting only to the change of ambient temperature, a problem would arise if, for example, a user places a book next to the instrument, thereby inadvertently partially blocking an air-input port. This condition would reduce airflow, causing internal case temperatures to rise. The fan speed would not increase because the ambient temperature did not change, resulting in overheating of the unit.

On the other hand, a decrease in internal temperature (perhaps, due to reduced power dissipation in a particular component) would require less airflow (with a corresponding decrease in fan noise). The apparatus of Hileman, et al. would fail to react to this condition also, and would operate at a greater than required fan speed and noise level.

In contrast to desktop computer equipment, there is a more stringent requirement to hold temperature constant in test and measurement instruments. It should be noted that without control, the temperature of a component would rise as the ambient air temperature rises in a substantially linear fashion. By use of cooling airflow control, the component temperature can be held substantially constant over a range of ambient temperatures (until the limit of the fan speed is reached). It is desirable that the temperature of certain critical components be held constant, because fluctuations in the temperature of these components may induce errors in the signal measurement process (i.e., adversely affect the calibration of the instrument. Neither of the above noted patents provides the solution to the problem of maintaining constant temperature to the extent required by test and measurement instruments while also reducing fan noise.

There is yet a further requirement imposed by modern manufacturing design in that it is desirable to use the same instrument platform (i.e., case and chassis components) in multiple product lines. This requirement is primarily driven by the need to reduce tooling costs for injection molded plastic parts of the instrument platform. Thus, for example, a logic analyzer may use most of the instrument platform components that are also used in the manufacturing of an oscilloscope, including the cooling system. Unfortunately, the cooling requirements of a logic analyzer tend to be very different from the cooling requirements of an oscilloscope. Moreover, the cooling requirements of each vary as different options are added to the basic instrument. What is needed is a cooling system that can be used for both of the above-noted applications. Such a system would need to provide adequate airflow for cooling for each application without providing excessive airflow in either of them, and would need to operate at reduced noise levels in each application.

SUMMARY OF THE INVENTION

A cooling system for a test and measurement instrument including a variable-speed fan, useful with different instruments having different configurations, employs a plurality of sensors disposed at predetermined locations within an enclosure of the instrument, and is software programmable with predetermined parameters of each particular configuration of each particular instrument. At least one of the sensors measures the temperature of a component that dissipates power at a substantially constant rate, and at least one of the sensors measures ambient air temperature, and does not include a heat source for providing heat to be measured.

DETAILED DESCRIPTION OF THE DRAWINGS

As noted above, the problem with attempting to control cooling fan speed on a common platform designed for multiple product lines is that each application exhibits its own heat generation characteristics. As also noted above, merely measuring ambient temperature, or measuring exhaust air temperature are not optimum solutions.

Figure 1:
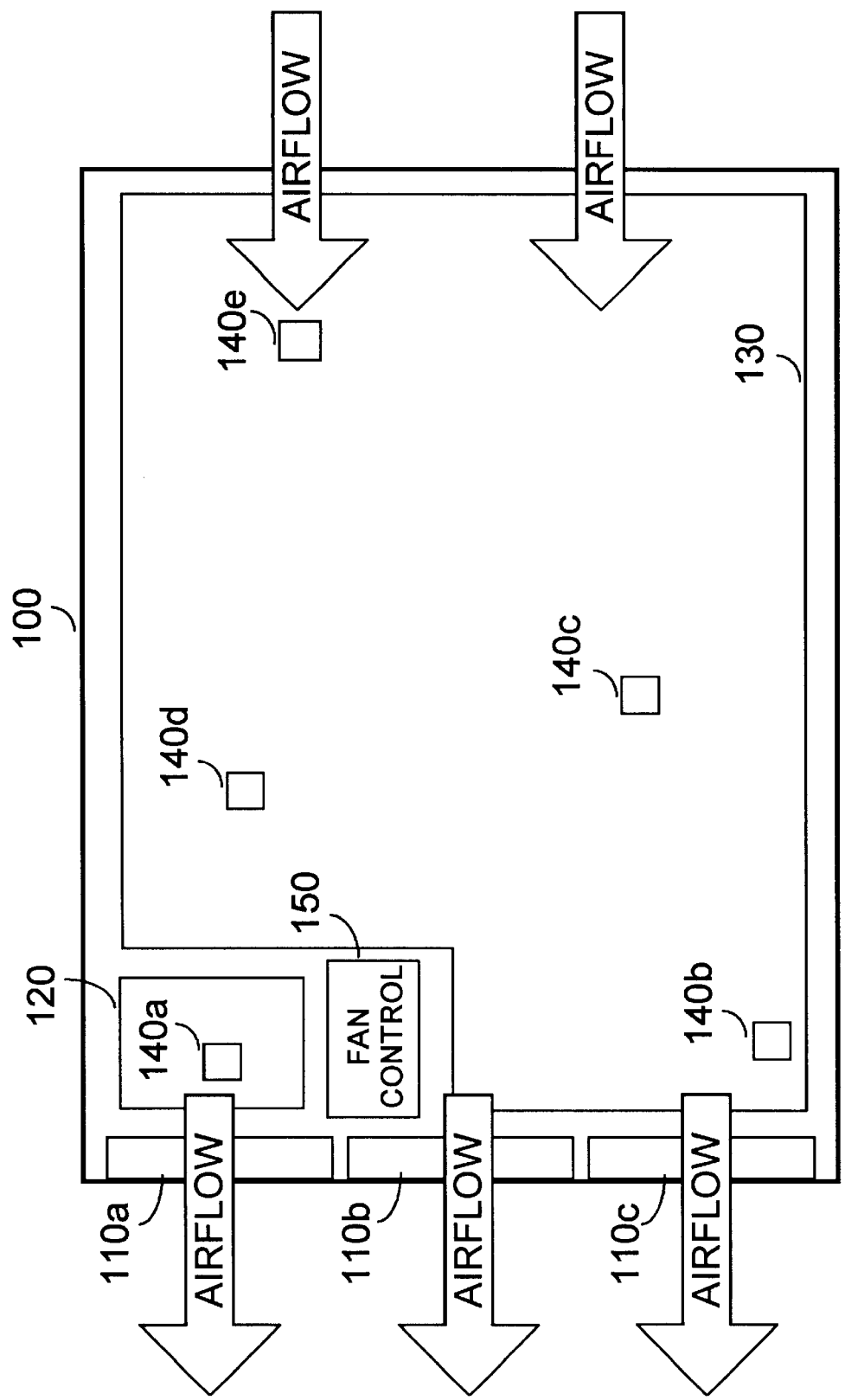
FIG. 1 is a simplified illustration of a top view of the interior of a test and measurement instrument in accordance with the subject invention.

Referring to FIG. 1, a cooling system for a common platform 100 intended to house, and operate with, different instruments, includes at least one controllable variable-speed fan 110a, and may include other fans 110b, 110c. Common platform 100 includes a circuit board 130 that defines a particular instrument such as a logic analyzer or an oscilloscope, a power supply unit 120, and a fan control unit 150. A plurality of thermal nodes 140a, 140b, 140c, and 140d, are placed predetermined locations within the enclosure of platform 100. Thermal node 140e senses ambient air temperature. Note that thermal node 140e is positioned near the air input port and in the intake air stream so that it may sense ambient air temperature, as nearly as possible. Fans 110a, 110b, and 110c, draw air through ventilation openings in the enclosure of platform 100 and across circuit board 130 where the moving air picks up excess heat. The warmed air is then expelled through the fan output opening.

One might think that selecting a particular component of a given instrument, and monitoring the heat given off by that component, would provide a useful thermal measurement. Unfortunately, many components operate in transient thermal modes, and thereby become inconsistent sources for feedback signals.

The subject application overcomes this obstacle and provides a consistent feedback signal source by providing independent thermal nodes 140a, 140b, 140c, 140d, and 140e. Each of thermal sensing node circuits 140a, 140b, 140c, and 140d, comprises a resistor (i.e., heat source) that is isolated from the instrument circuitry, and a temperature sensor. It is important to note that ambient temperature sensing node 140e does not include its own heat source. If ambient temperature sensor 140e did include its own heat source, then it would only provide true ambient temperature readings during a cold start (i.e., before the heat source warmed-up). By not including a heat source in ambient air temperature sensor 140e, and by positioning ambient air temperature sensor 140e close to an air inlet, it is possible to obtain true ambient readings during a warm restart of the instrument without having to wait for the instrument to cool down.

Figure 2:
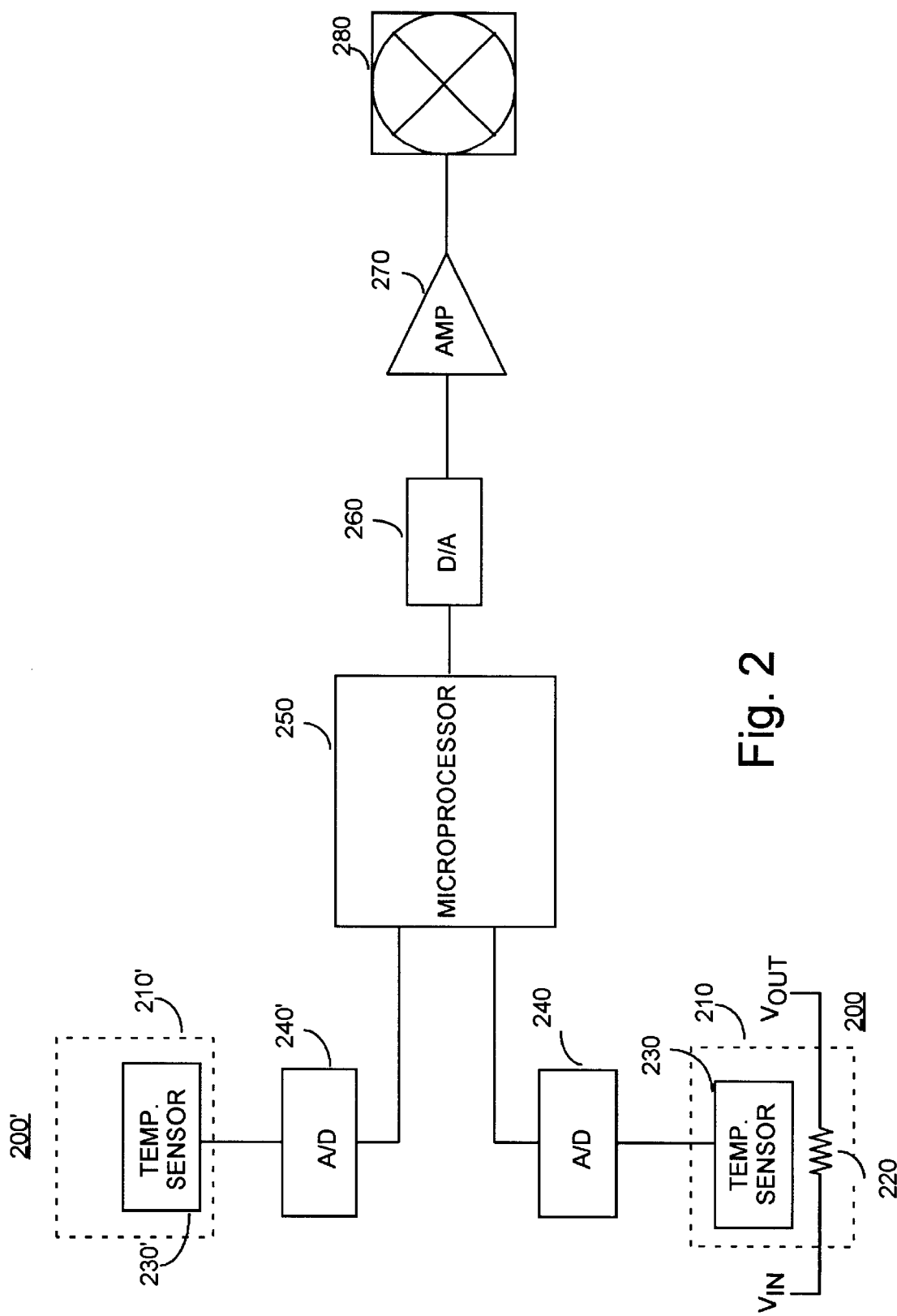
FIG. 2 is a simplified schematic of a thermal control system in accordance with the subject invention.

Referring to FIG. 2, two thermal sensing nodes are shown 200 and 200'. The difference between sensing node 200 and sensing node 200' is the absence of a heating element (heat source) in thermal node 200'. In this regard thermal sensing node 200' corresponds to ambient temperature thermal sensing node 140e of FIG. 1, and lacks a heat source because it is intended to sense ambient air temperature. For simplicity, only thermal sensing node 200 will be described. Thermal sensing node 200 exhibits a thermal boundary 210 that thermally isolates the node from other components which may be on the same physical circuit board. Thermal boundary 210 may be implemented by careful placement of the thermal sensing nodes away from components of the instrument which dissipate relatively high power, and by routing buses (which may conduct heat along them) away from the sensing nodes.

Thermal Sensing Node 200 includes a resistor heat source 220 and a thermal sensor 230. Thermal node 200 can either be mounted on its own circuit board or, as noted above, thermally isolated on a common circuit board with the instrument circuitry. In either case it must be located in an area with impinging airflow.

Preferably, resistor 220 is coupled across a constant voltage source to produce a constant heat for given conditions. That is, by applying a steady voltage to resistor 220, a constant or "steady-state" power output is generated. This causes resistor 220 to heat up and maintain a constant temperature for a given ambient air temperature and density. Sensor 230 senses the temperature at or near resistor 220. Sensor 230 may be, for example, a DS1621, manufactured by Dallas Semiconductor Corporation, Dallas Tex. Sensor 230 is coupled to an A/D converter unit 240, for converting the sensor output signal to digital data, and coupling the digital data to controller 250, of fan control unit 150 via a communications bus, such as an I²C bus. Controller 250 (which may be a microprocessor) evaluates the sensor information, and determines the proper signal required to control the temperature. The control signal is applied to a D/A converter 260 to generate an analog voltage or current suitable for driving a Fan Control Signal Amplifier 270, which amplifies the control signal and applies it to variable speed fan (or fans) 280.

The basic equation for the steady-state energy transfer of a component in a closed system is shown in equation 1.

$$Q = m^* c_p^* (T - T^* \text{hd} \infty) \qquad \text{EQ.1}$$

Where,

Q=Power Output (of resistor 220 in this case)

m=Mass Air Flow Rate $c_p$=Specific Heat

T=Component Temperature $T_\infty$=Ambient Temperature

Thus, $$= T_\infty = Q/(m^* c_p) \qquad \text{EQ.2}$$

It is herein recognized that if the ambient air temperature rises, the temperature of resistor 220 will also rise. Therefore, by selecting a given temperature as a "set point", the control system can compensate for fluctuations in ambient air temperature by adjusting fan air speed (i.e., airflow) to maintain the set point temperature at Thermal Sensing Node 200. Similarly, if the instrument's airflow inlet becomes impaired during operation (e.g., if another piece of equipment, or a book, were to be placed too close to the airflow inlet, thus causing a partial blockage), the mass airflow for a given fan voltage will be reduced. This condition will cause the temperature at Thermal Sensing Node 200 to increase, which will, in turn, cause the control system to compensate by increasing fan speed.

It is noted that the mass flow rate for air is proportional to the air density. Thus, changes in air density, such as those encountered during altitude changes, could be treated as a disturbance and compensated for by use of feedback fan control.

It is important to note that the platform level cooling strategy is based upon the fact that the thermal control feedback signal source is decoupled from any specific instrument. The components and methodology are consistent across the platform applications, yet are tunable for each specific product.

In operation, the system performs in three distinct modes or phases. Phase 1 is a system start-up phase. Referring to the flowchart of FIG. 3, in phase 1, fans 110a, 110b, 110c are controlled to operate at a fixed fan speed to prevent overheating during initialization of the instrument. Phase 1 occurs as soon as the instrument is powered-up at step 300. In step 310, a specified voltage is immediately sent to the fan or fans to ensure that cooling air is provided while the instrument is "booting" its software. The voltage can be any value within the operational range of the fan, but is preferably predetermined in accordance with knowledge of the thermal characteristics of the particular instrument embodied on the common platform. The priority during Phase 1 operation is to prevent overheating during the system start-up process.

Figures 3, 4, 5:
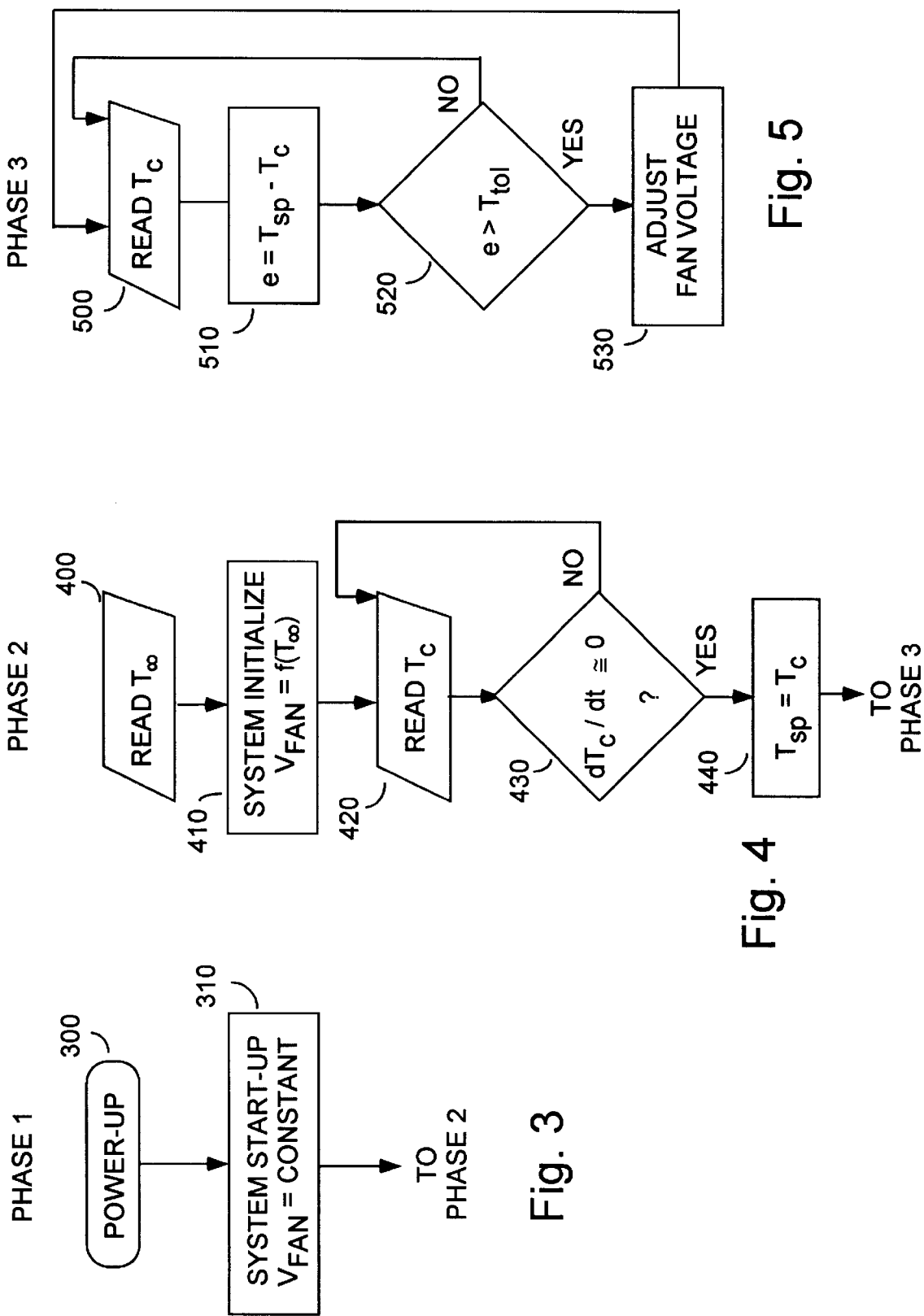
FIG. 3 is a flowchart for use in understanding the invention.
FIG. 4 is a flowchart for use in understanding the invention.
FIG. 5 is a flowchart for use in understanding the invention.

Phase 2 is an initialization phase of the cooling system and is illustrated in the flowchart of FIG. 4. In phase 2, the fan speed is set and measurements are made to find a steady-state point. This is an open-loop control phase wherein ambient air conditions are sampled and the fan speed is set accordingly. During this phase, the ambient temperature is measured at step 400 by means of an instrument-mounted sensor. The air density can either be measured by a sensor or assumed to be a fixed value. For example, a worst case air density could be assumed to be that of the highest altitude at which the instrument would normally be operated. At step 410, the fan speed is then selected for a given instrument and configuration based upon the ambient conditions. This can be accomplished by either employing a "look-up" table, or by use of a representative equation for fan control voltage as a function of ambient conditions. Preferably, the above-given equations are utilized, and the results are stored in a table. At step 420 the component temperature $T_c$ is read. A determination is made at step 430 as to whether or not steady state as been reached (within a tolerance). That is, once Phase 2 fan speed is established, the system waits (looping back along the NO path from decision diamond 430), until steady-state thermal operating conditions are reached prior to advancing to Phase 3. A sensor assigned to a critical component is used in determining when the critical component has warmed-up and reached a constant temperature. This is accomplished by verifying that the slope of the critical component temperature ($T_c$) is mathematically equal to (or very nearly equal to) zero. In practice, a slope of $T_c$ less than a particular value would indicate that the critical component has achieved a steady state. Once the steady-state has been achieved, the YES path is taken to step 440 wherein $T_c$ is stored as the "set point" ($T_{sp}$) and the control system proceeds to Phase 3. It is noted that the priority during Phase 2 operation is to reduce fan noise.

Phase 3 is a period of closed loop control mode of operation. During phase 3 the fan speed is continually adjusted in response to feedback from the thermal control sensors to maintain a constant temperature. Referring to FIG. 5, Phase 3 is entered at step 500 wherein a reading of $T_c$ is taken. The routine then advances to step 510 where the difference between the set point temperature and temperature at a thermal-sensing node is found. The routine then advances to step 520 to determine if the difference "e" is greater than a predetermined tolerance 520. If not, then the routine loops back along the NO path to take another measurement. If the temperature difference is greater than the tolerance, then the fan speed is adjusted accordingly by adjusting the voltage to the fan in step 530. The priority during Phase 3 operation is to maintain the temperature of the components close to the temperature of the components at a time just after warm-up, regardless of changes in ambient conditions.

Figure 6:
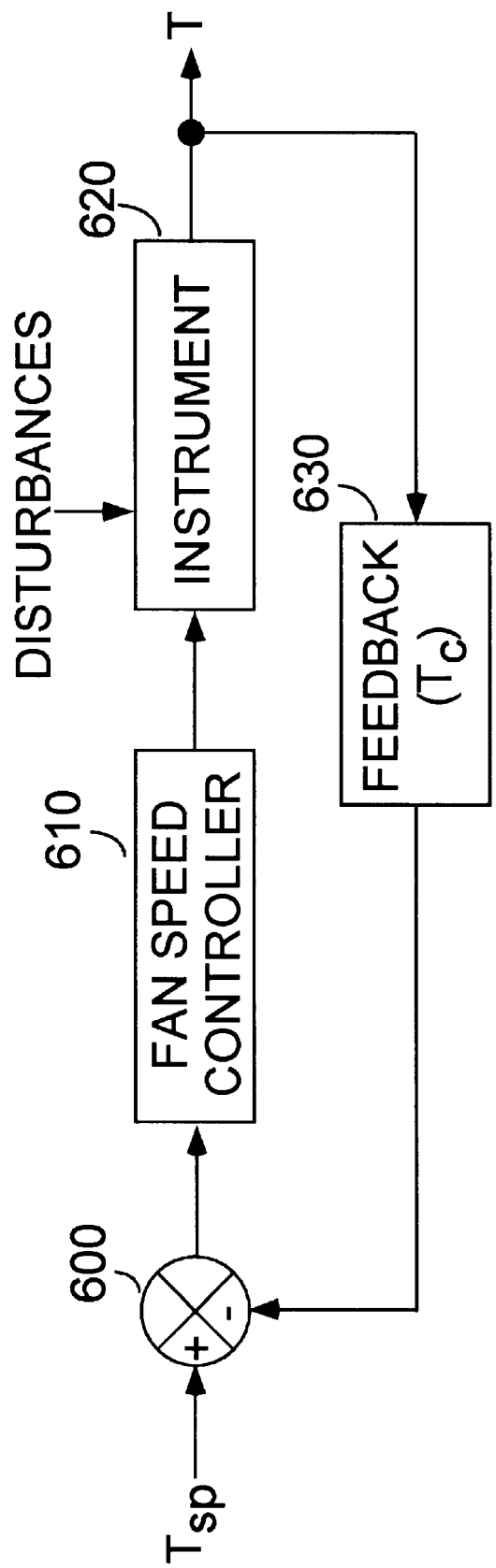
FIG. 6 is a functional high-level block diagram of the Thermal Control System of FIG. 2.

Referring to FIG. 6, the set-point temperature $T_{sp}$ is compared in circuit element 600 against a feedback signal representative of component temperature $T_c$. The result of this comparison is a control signal of the proper polarity to correct for deviations of the temperature from the set point temperature in either direction. The control signal is applied to a Fan Speed Controller unit 610 to adjust the voltage applied to the fan, thereby adjusting the speed of the fan, and consequently, controlling the airflow through the instrument platform. The Instrument 620 is subject to temperature variations due to disturbances such as fluctuations in ambient temperature, fluctuations in air density, and changes in the power dissipated by components of the instrument. Such disturbances will appear in a signal representative of the component temperature sensed at the output of the system of FIG. 6 (i.e., at the Thermal Sensor Nodes), and conveyed via Feedback unit 630 to be compared against the set-point temperature at the input of the system. Thus, the system is operating in a closed-loop fashion during Phase 3 operation.

The above-described system is a simple form of thermal control architecture commonly referred to as Single-Input-Single-Output (SISO). It is herein recognized that from one to any reasonable number of Thermal Sensor Nodes may be used to implement the system. Temperature compensation can be achieved via a number of controller strategies, such as Proportional Integral Derivative (PID) or Proportional and Derivative Control (PD), as is well known in the art, or by the use of control values stored in a look-up table, as noted above.

It is important to note that the parameters defining the thermal characteristics of each instrument type and configuration are software programmable. In addition, the weight given to each sensor node signal is also software programmable. The programmability of the subject invention provides the ability to use the cooling system in a plurality of applications without having to redesign the cooling system.

It is herein recognized that the fan controller may be a dedicated hardware controller or a dedicated microprocessor. Alternatively, the fan controller function may even be performed by the main instrument microprocessor.

It is important to note that the heat source of the sensor nodes is not required to be a fixed resistor, but rather can be a normal component of the instrument, so long as that instrument component generates heat at a substantially constant temperature (i.e., dissipates power at a substantially constant rate). It is also to be noted that the ambient temperature sensor node includes no heat source component at all.

In the case of a system having multiple fans, the fans could be responsive to the same control signal, or could operate independently in response to output signals of different thermal sensor nodes (i.e., different thermal sensor circuits).

What is claimed is:

1. A thermal control system, comprising:

an instrument including components which generate heat;

a variable speed fan for supplying cooling airflow for said instrument;

first thermal sensing circuitry for sensing ambient temperature and generating an ambient temperature representative signal;

second thermal sensing circuitry for sensing temperature at a specific component disposed within said instrument and generating a feedback signal, said specific component dissipating power at a substantially constant rate; and a controller for controlling the speed of said variable speed fan, said controller receiving said ambient temperature representative signal for controlling said fan during a period in which said instrument is warming-up to a steady state condition, said controller receiving said feedback signal, determining when said steady state condition has been reached and in response to said determination, storing a value representative of a set point temperature, said controller thereafter operating in response to said value representative of said set-point temperature and in response to said feedback signal.

2. The thermal control system of claim 1 wherein, said specific component is a resistor coupled across a power supply of said instrument for dissipating power at a substantially constant rate.

3. The thermal control system of claim 2 wherein:

said controller operates said system in a first mode for a predetermined time when the instrument is first turned-on, in said first mode said fan operates at a constant speed;

said controller operates said system in a second mode during a warm-up period of said instrument, said second mode terminating when said specific component raches a substantially constant temperature indicative of said steady state condition, said controller storing a signal representative of said constant temperature as said set-point temperature; and said controller operates said system in a third mode wherein said system is responsive to said value representative of said set-point temperature and responsive to said feedback signal.

4. The thermal control system of claim 3 wherein: said thermal-sensing circuitry includes a sensing unit and an analog to digital converter and said thermal sensing circuitry communicates with said controller via a communications bus.

5. The thermal control system of claim 1 wherein: said specific component is a component of said instrument that dissipates power at a substantially constant rate.

6. The thermal control system of claim 5 wherein:

said controller operates said system in a first mode for a predetermined time when the instrument is first turned-on, in said first mode said fan operates at a constant speed;

said controller operates said system in a second mode during a warm-up period of said instrument, said second mode terminating when said specific component reaches a substantially constant temperature indicative of said steady state condition, said controller storing a signal representative of said constant temperature as said set-point temperature; and said controller operates said system in a third mode wherein said system is responsive to said value representative of said set-point temperature and responsive to said feedback signal.

7. The thermal control system of claim 6 wherein: said thermal-sensing circuitry includes a sensing unit and an analog to digital converter and said thermal sensing circuitry communicates with said controller via a communications bus.

8. A thermal control system, comprising:

an enclosure for housing circuitry defining one of a plurality of instruments, each of said instruments exhibiting a unique set of thermal characteristics;

a circuit board having said circuitry mounted thereon;

a variable speed fan for providing airflow for cooling said circuitry;

a first thermal sensor node for sensing temperature and developing a first temperature representative signal in response to said temperature, said first thermal sensor node including a heat source for generating a generating heat at a substantially constant rate, and a temperature sensor mounted in proximity to said heat source;

a second thermal sensor node for sensing ambient temperature and generating an ambient heat representative signal in response thereto, said second thermal sensing node having no component for generating heat for sensing; and a fan controller for causing said fan to operate at one of a plurality of speeds in response to predetermined stored data representative of thermal characteristics of a respective one of said instruments, in response to said ambient temperature signal, and in response to said first temperature representative signal, in that order.

9. The thermal control system of claim 8 wherein: said thermal-sensing node includes a sensing unit and an analog to digital converter and said thermal sensing node communicates with said controller via a communications bus.

10. The thermal control system of claim 9 wherein: said heat source is a component of said instrument that generates heat at a substantially constant rate.

11. The thermal control system of claim 9 wherein, said heat source is a resistor coupled across a power supply of said instrument for dissipating power at a substantially constant rate.

* * * * *